(12) United States Patent
Sasaki et al.

(10) Patent No.: US 7,820,750 B2
(45) Date of Patent: Oct. 26, 2010

(54) SILICA POWDER AND USE THEREOF

(75) Inventors: Shuji Sasaki, Omuta (JP); Norihisa Nakashima, Omuta (JP)

(73) Assignee: Denki Kagaku Kogyo Kabushiki Kaisha, Tokyo (JP)

(*) Notice: Subject to any disclaimer, the term of this patent is extended or adjusted under 35 U.S.C. 154(b) by 0 days.

(21) Appl. No.: 12/091,998

(22) PCT Filed: Mar. 19, 2007

(86) PCT No.: PCT/JP2007/055503

§ 371 (c)(1),
(2), (4) Date: Apr. 29, 2008

(87) PCT Pub. No.: WO2007/108437

PCT Pub. Date: Sep. 27, 2007

(65) Prior Publication Data

US 2008/0255293 A1  Oct. 16, 2008

(30) Foreign Application Priority Data

Mar. 17, 2006  (JP) .............................. 2006-073626

(51) Int. Cl.
*C01B 33/12* (2006.01)
*C08K 3/34* (2006.01)
*C08K 3/36* (2006.01)

(52) U.S. Cl. ...................... 524/493; 423/335; 523/220; 524/492

(58) Field of Classification Search ................ 524/492, 524/493, 394; 264/15; 423/335, 336, 337, 423/338, 339, 340; 523/200, 212, 216, 220, 523/221

See application file for complete search history.

(56) References Cited

U.S. PATENT DOCUMENTS 6,169,136 B1 * 1/2001 Iriguchi et al. .............. 524/492

FOREIGN PATENT DOCUMENTS

| JP | 5 239321 | 9/1993 |
| JP | 11 124504 | 5/1999 |
| JP | 2001 151866 | 6/2001 |
| JP | 2003 146648 | 5/2003 |
| JP | 2004 59343 | 2/2004 |
| JP | 2004 123849 | 4/2004 |
| JP | 2005 119929 | 5/2005 |
| JP | 2005 306923 | 11/2005 |
| WO | WO 2005/061615 A1 | 7/2005 |

OTHER PUBLICATIONS

Machine Translation of JP 2005-306923.*
International Search Report for PCT/JP2007/055503, Mailed Jul. 3, 2007. (Present in file wrapper).*
Translation of Harada et al. (JP 2005-306923).*

* cited by examiner

*Primary Examiner*—Milton I Cano
*Assistant Examiner*—Darcy D LaClair
(74) *Attorney, Agent, or Firm*—Oblon, Spivak, McClelland, Maier & Neustadt, L.L.P.

(57) ABSTRACT

The present invention herein provides silica powder which can be incorporated into a sealing material at a high content to thus give a sealing material having excellent moldability. The silica powder at least has, in the volume-based frequency distribution of particle size as determined by the laser diffraction-scattering technique, a maximum frequency value for a mode peak 1 present in a particle size range extending from 1 to 4 μm and a maximum frequency value for a mode peak 2 present in a particle size range extending from 15 to 55 μm, wherein the maximum frequency value for the mode peak 2 is greater than that for the mode peak 1, the mode peak 2 has a shoulder, and the content of particles whose particle size ranges from 15 to 55 μm is larger than that of particles whose particle size ranges from 1 to 4 μm.

7 Claims, No Drawings

SILICA POWDER AND USE THEREOF

CROSS-REFERENCE TO RELATED APPLICATIONS

This application is a 371 of PCT/JP07/055503, filed Mar. 19, 2007, and claims priority to Japanese Patent Application No. 2006-073626, filed Mar. 17, 2006.

TECHNICAL FIELD

The present invention relates to silica powder and its applications.

BACKGROUND ART

There have recently been desired for the miniaturization, weight-reduction and quality-improvement of electronic machinery and tools and correspondingly, the semiconductor packages have rapidly been miniaturized and thinned, and the pitches thereof have likewise been rapidly narrowed. In addition, the surface-packaging suitable for the high density packaging on an interconnecting substrate has been one of the leading mainstreams of the packaging technique. Under such circumstances, there has likewise been required for the quality-improvement of a material for sealing semiconductor devices (hereunder referred to as "sealing material"), in particular, the improvement of the resistance to soldering heat and the moisture resistance, the reduction of the thermal expansion coefficient and the improvement of the electrical insulating characteristics thereof. To satisfy these requirements, it would be desirable to use a sealing material prepared by incorporating silica powder into epoxy resin in the highest possible amount. However, the melt viscosity of the resulting sealing material may increase because of the higher load (or higher content) of the silica powder and this in turn leads to an increase in the defective molding such as unloading of silica powder, wire-flowing and chip-shifting.

In such circumstances, regarding the sealing material having a high content of such silica powder, there have been proposed various kinds of techniques for the prevention of any impairment or damage of the fluidity and moldability of the sealing material. Examples of such techniques include a method in which the coefficient of variation observed for the particle size distribution is limited to a level of not higher than 10% to thus make the particle size distribution sharper (Patent Document 1); a method in which the degree of sphericity (the sphericity) is restricted to the range of from 0.75 to 1.0 for the particles having a particle size of not less than 45 μm to thereby further improve the sphericity degree for the coarse particles (Patent Document 2); a method in which the specific surface area of silica powder is limited to a level of not more than 5 $m^2/g$ to thus prevent any increase of the contact area between silica particles and a resin component (Patent Document 3); and a method which comprises adding, to a sealing material, a small quantity of spherical fine powder having an average particle size ranging from about 0.1 to 1 μm (Patent Document 4). These methods would permit the considerable improvement of the sealing materials, but the resulting materials have not yet satisfied the recent severe and strict requirements. For instance, these techniques have not yet satisfactorily solved such a problem that the sealing material is flooded through the air vent portion of the mold during molding the same (or the phenomenon called burr- or flash-formation).

Patent Document 1: JP-A 11-124504;
Patent Document 2: JP-A 2004-123849;
Patent Document 3: JP-A 2001-151866;
Patent Document 4: JP-A 5-239321.

DISCLOSURE OF THE INVENTION

Problems that the Invention is to Solve

Accordingly, it is an object of the present invention to provide silica powder which permits the elimination of the burr-formation to a level as low as possible in the sealing material having a high content of such silica powder and excellent in the moldability; and a composition and a sealing material, in which the silica powder is incorporated into at least either of rubber or resin.

Means for the Solution of the Problems

According to the present invention, there is provided silica powder characterized in that the silica powder has, in the volume-based frequency distribution of particle size as determined by the laser diffraction-scattering technique, the maximum frequency values for every corresponding mode (relative maximum) peaks present at least in a particle size range extending from 1 to 4 μm and in a particle size range extending from 15 to 55 μm (these peaks being referred to as "mode peak 1" and "mode peak 2", respectively); that the maximum frequency value for the mode peak 2 is greater than that for the mode peak 1; that the mode peak 2 has a shoulder; and that the content of the particles whose particle size ranges from 15 to 55 μm is larger than that of the particles whose particle size ranges from 1 to 4 μm.

In the present invention, the silica powder comprises 35 to 55% by volume of particles having a particle size ranging from 15 to 55 μm; 10 to 30% by volume of particles having a particle size ranging from 1 to 4 μm; not more than 5% by volume (including 0% by volume) of particles having a particle size of greater than 55 μm; not more than 10% by volume (including 0% by volume) of particles having a particle size of smaller than 1 μm; and the balance of particles having a particle size of greater than 4 μm and less than 15 μm. In this respect, it is preferred that the maximum frequency value for the mode peak 1 falls within the range of from 1.5 to 3.5 μm, while that for the mode peak 2 falls within the range of from 25 to 40 μm, and the shoulder of the mode peak 2 is preferably present in the particle size range of from 4 to 20 μm, and further preferably, the average sphericity degree of particles having a particle size of not less than 30 μm is not less than 0.85.

In addition, the present invention also relates to a rubber or resin composition comprising the silica powder incorporated into at least either of the rubber or resin.

EFFECTS OF THE INVENTION

According to the present invention, there are provided silica powder which permits the elimination of the problem concerning the burr-formation in the sealing material having a high content of such silica powder and excellent in the moldability; and a composition and a sealing material, in which the silica powder is incorporated into at least either of rubber or resin.

BEST MODE FOR CARRYING OUT THE INVENTION

The term "mode peak 1" is herein defined to be a peak corresponding to the size of particles whose maximum frequency value appears within a particle size range extending from 1 to 4 μm, in the volume-based frequency distribution of particle size as determined by the laser diffraction-scattering technique. In addition, the term "mode peak 2" is herein defined to be a peak corresponding to the size of particles whose maximum frequency value appears within a particle size range extending from 15 to 55 μm, in the same volume-based frequency distribution of particle size. The size of particles, the frequency of which is maximum, herein means the particle size corresponding to the median in the channel showing the highest frequency, observed in the volume-based frequency distribution of particle size which is determined according to the laser diffraction-scattering technique while dividing the particle size range extending from 0.04 to 500 μm into 100 sections. In this respect, however, if at least two peaks are present in the region extending from 1 to 4 μm or the region extending from 15 to 55 μm, the size of particles, the frequency of which is maximum, is determined by comparing the frequencies of these mode peaks with one another to thus determine the particle size having the maximum frequency value. An example of the device used for the determination of the volume-based frequency distribution of particle size as determined by the laser diffraction-scattering technique is a cilas particle size distribution-determining device: "CILAS 1064" (available from Cilas Company). The use of this device would permit the automatic determination of the mode peak 1 and the mode peak 2.

The average sphericity of the silica powder is determined by inputting images of particles obtained through the use of a microscope (such as "Model SMZ-10 Type" available from Nikon Corporation), a scanning electron microscope) and the like in an image-analysis device (for instance, one available from Nippon Avionics Co., Ltd.). Specifically, the projected area (A) and the peripheral length or perimeter (PM) of each particle are determined on the basis of the micrographs thus obtained. In this case, assuming that the area of a true circle corresponding to the perimeter (PM) is (B), the circularity of the corresponding particle is defined to be A/B. Accordingly, assuming that a true circle has a perimeter (PM) identical to that of the sample, the relation: $B=\pi \times (PM/2\pi)^2$ can be derived, since $PM=2\pi r$ and $B=\pi r^2$. Consequently, the sphericity of each individual particle can be defined to be as follows: Sphericity Degrees $=A/B=A\times 4\pi/(PM)^2$. Arbitrarily selected 200 particles of not less than 30 μm are inspected for the sphericities according to the foregoing method and the results are averaged and the resulting average value is defined to be the average sphericity degree of the sample.

The silica powder of the present invention is defined by the following four essential points: The first essential point is that the silica powder has at least a mode peak 1 and a mode peak 2. The silica powder may have another mode peak in addition to these mode peaks. The mode peak 2 exists in a particle size region extending from 15 to 55 μm. It is herein suitable that the content of the silica particles having a particle size ranging from 15 to 55 μm preferably ranges from 35 to 55% by volume, and more preferably 40 to 50% by volume. On the other hand, the mode peak 1 exists in a particle size region extending from 1 to 4 μm. In this connection, it is suitable that the content of the silica particles having a particle size ranging from 1 to 4 μm preferably ranges from 10 to 30% by volume, and more preferably 20 to 25% by volume.

The particles, whose particle size ranges from 15 to 55 μm (hereunder also referred to as "principal particles") in which the mode peak 2 is present, are particulate components serving as nuclei of a composition, in particular, a sealing material and if the principal particles have a particle size of less than 15 μm, the melt viscosity of the sealing material increases, while the moldability thereof is reduced. On the other hand, when the particle size of the principal particles exceeds 55 μm, various problems may arise, for instance, damaging of semi-conductor chips, wire breakage and wire sweep during molding the same. Particularly preferred principal particles are those having a particle size ranging from 25 to 40 μm and the content thereof in the silica powder ranges from 40 to 50% by volume. On the other hand, the particles having a particle size ranging from 1 to 4 μm enter into the interstices formed between the principal particles to thus make the packing structure of the particles denser. The mode peak 1 should likewise be present in the particle size region extending from 1 to 4 μm. The dense packing structure of the particles would permit the charging of the silica powder into the composition at a high content and the reduction or control of the burr-formation.

The second requirement of the present invention is that the maximum frequency value for the mode peak 2 is greater than that for the mode peak 1, or that the height of the mode peak 2 is higher than that of the mode peak 1. When this requirement is not satisfied, the viscosity of the resulting composition, in particular, the sealing material undesirably increases and this in turn results in the lowering of the fluidity thereof. The particle size corresponding to the maximum frequency value for the mode peak 1 preferably has a correlation with that for the mode peak 2 such that the former particle size is 0.05 to 0.15 time the latter particle size. Especially, it is further preferred that the maximum frequency value for the mode peak 2 is observed in a particle size range of from 25 to 40 μm and the maximum frequency value for the mode peak 1 appears in a particle size range of from 1.5 to 3.5 μm.

The third requirement of the present invention is that the mode peak 2 has a shoulder. The term "shoulder" used herein means that the mode peak 2 includes an inflection point within the same. In other words, the term means that a particulate component having a specific particle size is present in a higher quantity. The presence of such a shoulder means that, when incorporating the corresponding silica powder into rubber or resin, the particulate component constituting the shoulder portion can pass through the spaces formed between the principal particles corresponding to the mode peak 2 and that the particles corresponding to the mode peak 1 can enter into the interstices formed between the particulate components constituting the shoulder in high efficiency and therefore, the silica powder can further be packed in a higher packing density. The shoulder for the mode peak 2 is preferably present in the particle size range of from 4 to 20 μm and the content of the particles constituting the shoulder preferably ranges from 10 to 20% by volume and, in particular, 13 to 18% by volume. Moreover, the size of the shoulder is preferably 1.3 to 1.8% by volume as expressed in terms of the maximum frequency value. The presence of any shoulder can be confirmed by carrying out the measurement of the volume-based frequency distribution of particle size according to the foregoing laser diffraction-scattering technique.

The fourth requirement of the present invention is that the content of the particles whose particle size ranges from 15 to 55 μm is larger than that of the particles whose particle size ranges from 1 to 4 μm. If the foregoing relation is reversed, a large quantity of particles having a particle size ranging from 1 to 4 μm cannot enter into the interstices between the particles of 15 to 55 μm, this accordingly prevents the formation of a desired denser packaging structure and the melt viscosity of the resulting composition may increase in a higher probability.

In the silica powder of the present invention, the content of particles having a particle size of greater than 55 μm is not more than 5% by volume (including 0% by volume) and the content of particles having a particle size of smaller than 1 μm is not more than 10% by volume (including 0% by volume).

The balance of the silica powder is constituted by silica particles having a particle size of greater than 4 μm and less than 15 μm. In addition, the burr-formation control effect of the present invention can further be improved by adjusting the average sphericity of the particles having a particle size of not less than 30 μm to a level of not less than 0.85 and particularly not less than 0.93.

The silica powder is preferably amorphous silica powder so that the thermal expansion coefficient of the sealing material approaches that of the semiconductor chip to be sealed as close as possible. The amorphous silica powder can be prepared by treating the crystalline silica powder through melting.

The rate of amorphousness of the amorphous silica can be determined by carrying out the X-ray diffraction analysis of a sample for the 2θ of CuK α-rays ranging from 26 to 27.5 degrees while using a powder X-ray diffraction analyzer (for instance, "Model Mini Flex available from RIGAKU Co., Ltd.) and then determining the rate of amorphousness on the basis of the intensity ratio of specific diffraction peaks thus obtained. More specifically, the crystalline silica shows a main peak at 26.7 degs. in the X-ray diffraction pattern, while the amorphous silica is free of any such peak. For this reason, if a sample includes both crystalline and amorphous silica, the height of the main peak appearing at an angle of 26.7 degs. is proportional to the content of the crystalline silica. Accordingly, the content of the crystalline silica ([the intensity of the X-ray diffraction for the sample]/[the intensity of the X-ray diffraction for the reference sample of crystalline silica]) is calculated from the ratio of the X-ray intensity observed for the sample to that observed for the reference sample of crystalline silica and then the rate of amorphousness is calculated according to the following equation: Rate of Amorphousness (%)=(1−Content of Crystalline Silica (the foregoing ratio))× 100.

The silica powder of the present invention can be prepared by appropriately combining the unitary operations such as the pulverization of silica powder, the granulation and classification thereof and the blending of silica particles having different average particle sizes, while likewise appropriately selecting the conditions therefor. In brief, the silica powder of the present invention can be prepared by blending principal particles having the mode peak 2, particles required for forming the shoulder of the mode peak 2, and particles having a particle size ranging from 1 to 4 μm and having the mode peak 1, in predetermined amounts.

The composition of the present invention will now be described in detail. The composition of the present invention comprises rubber and/or resin and the silica powder of the invention which is incorporated into at least either one of the rubber or the resin. The content of the silica powder to be incorporated into the composition is not restricted to any specific one and the content thereof suitably ranges, for instance, from 10 to 99% by mass and preferably 50 to 95% by mass.

Examples of rubber materials are silicone rubber, urethane rubber, acrylic rubber, butyl rubber, ethylene-propylene rubber, and ethylene-vinyl acetate copolymers. In addition, examples of the foregoing resins are epoxy resins, silicone resins, phenolic resins, melamine resins, urea resins, unsaturated polyesters, fluorine resins, polyimides, polyamide-imide resins, polyamides such as polyether-imides, polyesters such as polybutylene terephthalate and polyethylene terephthalate, polyphenylene sulfide, completely aromatic polyesters, polysulfones, liquid crystalline polymers, polyether sulfones, polycarbonates, maleimide-modified resins, ABS resins, AAS (acrylonitrile-acryl rubber/styrene) resins, and AES (acrylonitrile/ethylene/propylene/diene rubber/styrene) resins.

In respect of the sealing material, preferably used herein include epoxy resins each containing at least two epoxy groups in the molecule. Specific examples thereof include phenol-novolak type epoxy resins, o-cresol-novolak type epoxy resins, products obtained through epoxydation of novolak resins derived from phenols and aldehydes, glycidyl ethers such as bisphenol A, bisphenol F and bisphenol S, glycidyl ester acid-epoxy resins obtained by the reactions of polybasic acids such as phthalic acid and dimer acids with epichlorohydrin, linear ahpatic epoxy resins, alicyclic epoxy resins, heterocyclic epoxy resins, alkyl-modified polyfunctional epoxy resins, β-naphthol novolak type epoxy resins, 1,6-dihydroxy-naphthalene type epoxy resins, 2,7-dihydroxy-naphthalene type epoxy resins, bis-hydroxy biphenyl type epoxy resins, and epoxy resins in which halogen atoms such as bromine atoms are introduced for imparting flame retardant properties to the resins. Suitably used herein include, for instance, o-cresol-novolak type epoxy resins, bis-hydroxy biphenyl type epoxy resins and naphthalene skeleton-containing epoxy resins, from the viewpoint of, in particular, resistance to moisture and resistance to solder-reflowing.

In respect of the agent used herein for curing the epoxy resin is not restricted to any specific one insofar as it can react with the epoxy resin to cure the same. Examples thereof include novolak type resins, poly(p-hydroxy styrene) resins, bisphenol compounds such as bisphenol A and bisphenol S, tri-functional phenols such as pyrogallol and fluoro-glucinol, acid anhydrides such as maleic anhydride, phthalic anhydride, and pyromellitic anhydride, and aromatic amines such as m-phenylene-diamine, diamino-diphenyl methane, and diamino-diphenyl sulfone. A curing-accelerator may be incorporated into the resin composition for the acceleration of the foregoing curing reaction. Such a curing-accelerator usable herein may be, for instance, 1,8-diazabicyclo(5,4,0)-undecene-7, triphenyl phosphine, benzyl dimethylamine, and 2-methylimidazole.

The composition of the present invention can be prepared by, for instance, blending the predetermined amounts of the foregoing ingredients in, for instance, heated rolls, a kneader, or a single-screw or twin-screw extruder; cooling the kneaded product; and then pulverizing the kneaded and cooled product. The sealing material of the present invention is one comprising the composition according to the present invention. Semiconductor devices can be sealed according to any known molding technique such as the transfer molding technique or the multiple plunger-molding technique.

EXAMPLES

Examples 1 to 5 and Comparative Examples 1 to 8

Pulverized natural silica was melted and formed into spherical particles by feeding the same to the flame formed through the combustion of LPG and oxygen gas to thus obtain spherical amorphous silica powder. Thirteen kinds of powdery products were prepared such as those listed in the following Tables 1 and 2, while appropriately adjusting the conditions for forming the flame, the particle size of the raw material, the feed rate of the raw material, the conditions for the classification and the conditions for blending. The control of the particle size distribution was principally carried out by the control of the particle size of the raw powder and the multi-stage classification treatment of the particulate material obtained after the step for forming the powder into spherical particles. Moreover, the sphericity of the silica powder was mainly controlled by adjusting the flame-forming conditions and the feed rate of the raw material. Among the resulting products, particulate materials referred to as Powders A to E were powdery silica products of the present invention, while those referred to as Powders F to M were powdery silica products according to Comparative Examples. All of Powders A to M were found to have a rate of amorphousness (amorphousness rate) of not less than 99% and an average sphericity, as determined for each entire particulate material, of not less than 0.86. The particle size characteristic properties of these silica powders were determined according to the methods discussed above. The results thus obtained are listed in Tables 1 and 2.

To evaluate the characteristic properties of the spherical amorphous silica powders thus obtained as the filler for a sealing material, there were added, to 90% (by mass; the same rule will also apply to the following) of each of the Powder A to M prepared above, 4.3% of 4,4'-bis(2,3-epoxy-propoxy)-3,3',5,5'-tetramethyl biphenyl type epoxy resin; 4.4% of a phenol-novolak type resin; 0.2% of triphenyl phosphine; 0.5% of γ-glycidoxy-propyl trimethoxy-silane; 0.2% of carbon black; and 0.4% of an ester wax, followed by dry-blending of the same in a Henschel mixer and the subsequent kneading, under heating, of the resulting compound using a forward engage-type twin-screw extrusion-kneader (screw diameter: 25 mm; the kneading disk length: 10 Dmm; the paddle rotational number: 100 rpm; the discharge rate: 4 kg/hr; the temperature of heater: 100 to 105° C.). The discharged product was then cooled in a cooling press and then pulverized therein to give a material for sealing semiconductor devices. The resulting material was inspected for the moldability and the length of burr formed during molding according to the following methods. The results thus obtained are likewise listed in Tables 1 and 2.

(1) Moldability (Spiral Flow)

The spiral flow values of the foregoing epoxy resin compositions were determined using a transfer molding machine provided with spiral flow-determining mold according to EMMI-I-66 (Epoxy Molding Material Institute; Society of Plastic Industry). The transfer molding operations were performed under the following conditions: Mold temperature: 175° C.; molding pressure: 7.4 MPa; and dwell time: 90 seconds.

In this connection, the higher the resulting value, the higher the fluidity and the better the moldability of the resulting composition.

(2) Burr

There were prepared 48 semiconductor packages of TSOP (Thin Small Outline Package; 10 mm×21 mm; thickness: 1.0 mm; simulated IC chip size: 9 mm×18 mm; lead frame made of 42 alloy) having a 32-pin LOC (Lead on Chip) structure using a transfer-molding machine. Thereafter, the burr lengths of these packages were determined and then averaged. The transfer molding operations were performed under the following conditions: Mold temperature: 175° C.; molding pressure: 7.4 MPa; and dwell time: 90 seconds.

The larger the resulting average value of the burr length, the smaller the probability of burr-formation.

TABLE 1

|  |  | Example No. | | | | |
|---|---|---|---|---|---|---|
|  |  | 1 | 2 | 3 | 4 | 5 |
|  |  | Powder Name | | | | |
|  |  | A | B | C | D | E |
| Mode Particle Size: | P1 (µm) | 1.6 | 2.4 | 2.4 | 2.0 | 2.2 |
|  | P2 (µm) | 30 | 45 | 28 | 38 | 30 |
| Max. frequency value of P1 (% by vol.) | | 1.4 | 1.4 | 1.4 | 2.2 | 2.1 |
| Max. frequency value of P2 (% by vol.) | | 3.1 | 2.9 | 3.2 | 2.8 | 2.9 |
| Content of particles (1~4 µm) (% by vol.) | | 24.8 | 22.1 | 28.9 | 22.6 | 26.8 |
| Content of particles (15~55 µm) (% by vol.) | | 43.9 | 46.3 | 42.1 | 50.2 | 42.2 |
| Content of particles (>4 µm up to <15 µm) (% by vol.) | | 25.5 | 25.7 | 23.1 | 18.1 | 24.3 |
| Position of shoulder (µm) | | 4.0~10 | 4.3~11 | 4.6~11 | 4.3~10 | 4.3~11 |
| Max. frequency value of shoulder (% by vol.) | | 1.5 | 1.4 | 1.5 | 1.4 | 1.5 |
| Content of particles (>55 µm) (% by vol.) | | 2.3 | 2.4 | 2.1 | 1.9 | 1.1 |
| Content of particles (<1 µm) (% by vol.) | | 3.5 | 3.5 | 3.8 | 7.2 | 5.6 |
| Average sphericity of particles (≧30 µm) (% by vol.) | | 0.88 | 0.89 | 0.94 | 0.91 | 0.92 |
| Spiral flow (cm) | | 111 | 113 | 120 | 115 | 114 |
| Burr length (mm) | | 2.4 | 2.4 | 2.1 | 1.7 | 2.4 |

TABLE 2

|  |  | Comparative Example No. | | | |
|---|---|---|---|---|---|
|  |  | 1 | 2 | 3 | 4 |
|  |  | Powder Name | | | |
|  |  | F | G | H | I |
| Mode particle Size: | P1 (µm) | 1.8 | 2.4 | 6.0 | 2.2 |
|  | P2 (µm) | 30 | 45 | 32 | 14 |
| Max. frequency value of P1 (% by vol.) | | 1.4 | 1.5 | 1.5 | 1.6 |
| Max. frequency value of P2 (% by vol.) | | 3.1 | 2.9 | 3.2 | 2.7 |
| Content of particles (1~4 µm) (% by vol.) | | 25.0 | 22.6 | 19.6 | 27.8 |
| Content of particles (15~55 µm) (% by vol.) | | 44.1 | 45.9 | 43.9 | 35.6 |
| Content of particles (>4 µm up to <15 µm) (% by vol.) | | 25.1 | 25.6 | 32.0 | 31.0 |
| Position of shoulder (µm) | | None | None | 7.5~17 | 4.0~9.0 |

TABLE 2-continued

| | | | | |
|---|---|---|---|---|
| Max. frequency value of shoulder (% by vol.) | None | None | 1.5 | 1.5 |
| Content of particles (>55 μm) (% by vol.) | 2.3 | 2.4 | 2.3 | 1.1 |
| Content of particles (<1 μm) (% by vol.) | 3.5 | 3.5 | 2.2 | 4.5 |
| Average sphericity of particles (≧30 μm) (% by vol.) | 0.86 | 0.88 | 0.90 | 0.91 |
| Spiral flow (cm) | 97 | 99 | 98 | 88 |
| Burr length (mm) | 2.7 | 2.8 | 3.6 | 2.1 |

| | Comparative Example No. | | | |
|---|---|---|---|---|
| | 5 | 6 | 7 | 8 |
| | Powder Name | | | |
| | J | K | L | M |
| Mode Particle Size: P1 (μm) | 2.4 | 0.8 | 2.2 | 2.0 |
| P2 (μm) | 30 | 30 | 60 | 28 |
| Max. frequency value of P1 (% by vol.) | 2.3 | 1.4 | 1.6 | 2.3 |
| Max. frequency value of P2 (% by vol.) | 2.2 | 3.2 | 2.5 | 2.3 |
| Content of particles (1~4 μm) (% by vol.) | 29.7 | 22.6 | 29.6 | 35.1 |
| Content of particles (15~55 μm) (% by vol.) | 35.8 | 46.8 | 36.3 | 33.4 |
| Content of particles (>4 μm up to <15 μm) (% by vol.) | 29.4 | 19.8 | 19.6 | 25.7 |
| Position of shoulder (μm) | 4.3~11 | 3.8~10 | 4.6~12 | 4.3~10 |
| Max. frequency value of shoulder (% by vol.) | 1.4 | 1.6 | 1.5 | 1.4 |
| Content of particles (>55 μm) (% by vol.) | 2.0 | 2.2 | 13.6 | 1.9 |
| Content of particles (<1 μm) (% by vol.) | 3.1 | 8.6 | 0.9 | 3.9 |
| Average sphericity of particles (≧30 μm) (% by vol.) | 0.90 | 0.92 | 0.92 | 0.91 |
| Spiral flow (cm) | 81 | 95 | 116 | 74 |
| Burr length (mm) | 2.6 | 2.6 | 5.1 | 2.9 |

As will be clear from the comparison of the results obtained in Examples with those obtained in Comparative Examples, the compositions comprising the silica powders prepared in Examples were excellent in the moldability and showed the excellent burr-formation control effect or small burr-lengths even when the rate of packing of the silica powder was equal to 90% by mass.

INDUSTRIAL APPLICABILITY

The silica powder according to the present invention can be used as a resin-molding part such as a molding compound for forming, for instance, parts of automobiles, portable electronic machinery and tools and household appliance, as well as fillers for use in putty, sealing materials, buoyancy materials for ships, artificial timbers, reinforced cement exterior wall materials, light-weight exterior wall materials and sealing materials. In addition, the composition of the present invention can be used in the prepreg such as that for printed circuit boards, which can be prepared by, for instance, impregnating a glass woven fabric, a glass nonwoven fabric or another organic substrate with the composition; in electronic parts obtained by molding, with heating, one or a plurality of prepreg sheets together with, for instance, a copper foil; and in the preparation of cladding materials for electric wires, sealing materials for semiconductor devices and varnishes. Moreover, the sealing material according to the present invention is excellent in the fluidity and packaging characteristics and therefore, it can be used as a sealing agent making it easy to form semiconductor-packages which are miniaturized and thinned and whose pitches are likewise narrowed.

What is claimed is:

1. A silica powder at least having, in a volume-based frequency distribution of particle size as determined by a laser diffraction-scattering technique, a maximum frequency value for a mode peak 1 present in a particle size range extending from 1.5 to 3.5 μm and a maximum frequency value for a mode peak 2 present in a particle size range extending from 25 to 40 μm, wherein
   the maximum frequency value for the mode peak 2 is greater than that for the mode peak 1;
   the mode peak 2 has a shoulder;
   the content of particles whose particle size ranges from 15 to 55 μm is larger than that of particles whose particle size ranges from 1 to 4 μm;
   the silica powder comprises:
      35 to 55% by volume of particles having a particle size ranging from 15 to 55 μm;
      10 to 30% by volume of particles having a particle size ranging from 1 to 4 μm;
      0 to 5% by volume of particles having a particle size of greater than 55 μm;
      0 to 10% by volume of particles having a particle size of smaller than 1 μm; and
      the balance of particles having a particle size of greater than 4 μm and less than 15 μm; and
   the shoulder for the mode peak 2 is present in the particle size range of from 4 to 20 μm and the content of the particles constituting the shoulder is 10 to 20% by volume of the total particles of the silica powder.

2. The silica powder of claim 1, wherein the average sphericity degree of the particles having a particle size of not less than 30 μm is not less than 0.85.

3. The silica powder according to claim 1, wherein the particles having a particle size ranging from 15 to 55 μm are present in the silica powder in an amount of 40 to 50% by volume.

4. The silica powder according to claim 1, wherein the particles having a particle size ranging from 1 to 4 μm are present in the silica powder in an amount of 20 to 25% by volume.

5. The silica powder according to claim 1, wherein the volume frequency of the shoulder of mode peak 2 is 1.3 to 1.8%.

6. A composition comprising the silica powder of claim 1, which is incorporated into at least either one of rubber or resin.

7. A semiconductor-sealing material comprising the composition of claim 6.

* * * * *